United States Patent [19]
Ramesh

[11] Patent Number: 5,519,235
[45] Date of Patent: May 21, 1996

[54] POLYCRYSTALLINE FERROELECTRIC CAPACITOR HETEROSTRUCTURE EMPLOYING HYBRID ELECTRODES

[75] Inventor: Ramamoorthy Ramesh, Tinton Falls, N.J.

[73] Assignee: Bell Communications Research, Inc., Morristown, N.J.

[21] Appl. No.: 341,728

[22] Filed: Nov. 18, 1994

[51] Int. Cl.$^6$ .......................... H01L 29/76; H01L 31/062
[52] U.S. Cl. ...................... 257/295; 257/763; 361/321.3; 428/701; 437/60; 437/919
[58] Field of Search ........................................ 257/295, 310, 257/763; 361/321.3; 437/60, 919

[56] References Cited

U.S. PATENT DOCUMENTS 5,155,658  10/1992  Inam et al. .................. 361/321
5,248,564  9/1993  Ramesh ........................... 428/688
5,270,298  12/1993  Ramesh ........................... 505/1
5,387,459  2/1995  Hung ............................... 428/209

*Primary Examiner*—Robert P. Limanek
*Attorney, Agent, or Firm*—Leonard Charles Suchyta; Lionel N. White

[57] ABSTRACT

Ferroelectric capacitor heterostructures exhibiting exceptional reliability and resistance to fatigue and imprinting comprise hybrid electrodes of highly conductive platinum with polycrystalline metallic oxide and ferroelectric materials deposited on Si-CMOS-compatible substrates without the requirement for interposed crystallographic orientation templates.

13 Claims, 5 Drawing Sheets

POLYCRYSTALLINE FERROELECTRIC CAPACITOR HETEROSTRUCTURE EMPLOYING HYBRID ELECTRODES

BACKGROUND OF THE INVENTION

Ferroelectric thin films of high crystalline quality have recently been grown on silicon substrates using suitable combinations of buffer layers and templates to initiate the crystallization and formation of the desired material phase in a proper crystallographic orientation. For example, yttria-stabilized zirconia (YSZ) has been used as a buffer layer on a chemically cleaned [100] Si wafer to provide a crystalline template for the growth of subsequent layers of cuprate superconductors, such as yttrium-barium-cuprate (YBCO). In U.S. Pat. No. 5,155,658, a high crystalline quality, c-axis oriented YBCO was used as a structural template for subsequent growth of a pseudo-cubic lead zirconium titanate (PZT) perovskite ferroelectric layer and a covering YBCO electrode layer to yield a ferroelectric memory element. High growth temperatures presented a problem in Si-CMOS processing, however.

Improved, lower temperature crystallographic growth was later achieved with cubic metal oxides, such as lanthanum-strontium-cobalt oxide (LSCO), employing a layered perovskite, e.g., bismuth titanate (BTO), template layer to initiate c-axis orientation in LSCO and PZT ferroelectric overlayers, as described in U.S. Pat. No. 5,270,298. Further improvement in the growth of ferroelectric devices was realized in U.S. Pat. No. 5,248,564 through the use of lead-lanthanum-zirconium-titanate (PLZT) in a LSCO/PLZT/LSCO heterostructure which could be compatibly formed on a CMOS $SiO_2$/Si substrate by means of the layered BTO, or similar bismuth tungstate (BWO), template.

Although the temperature limitations had thus been surmounted and CMOS compatibility achieved, the electrical conductivity of the heterostructure on a $SiO_2$/Si substrate was insufficient for effective integrated circuit application. This shortcoming was remedied by the intermediate epitaxial deposition of oriented platinum on the layered perovskite template according to the procedure disclosed in copending application, Ser. No. 08/318,587, filed 5 Oct. 1994 and commonly assigned with this application. The additional operations of template and crystallographic layer growth significantly extended device processing, however.

SUMMARY OF THE INVENTION

It has now been discovered in the present invention that, surprisingly, the layered perovskite, e.g., BTO, template interlayer may be dispensed with and that a thin film of metal, such as platinum, routinely grown upon a commercial-grade Si wafer substrate having an amorphous $SiO_2$ surface primed with Ti, Ta, or $TiO_2$ will provide the desired electrical sheet conductivity and will also support satisfactory polycrystalline growth of any number of metallic oxide capacitor electrode materials, such as LSCO, $LaSrCrO_3$, $RuO_x$, and $SrRuO_3$, as well as subsequent similar growth of at least one intermediate perovskite ferroelectric layer of, for example, PLZT or PZT. The desirable ferroelectric performance of such materials, especially with respect to resistance to fatigue and imprint, is not impaired by the polycrystalline growth and may be further optimized by doping with 1%–10% lanthanum or niobium.

The earlier-discovered manner of processing the layered heterostructure, for example by controlled cooling of the growth layer to its operating ambient in an oxygenating atmosphere, continues to have considerable positive effect upon the ferroelectric performance of a resulting device, particularly in its reliability as manifest with respect to such properties as fatigue, aging, retention, and imprint.

BRIEF DESCRIPTION OF THE DRAWING

The present invention will be described with reference to the accompanying drawing of which.

DESCRIPTION OF THE INVENTION

Figure 1:
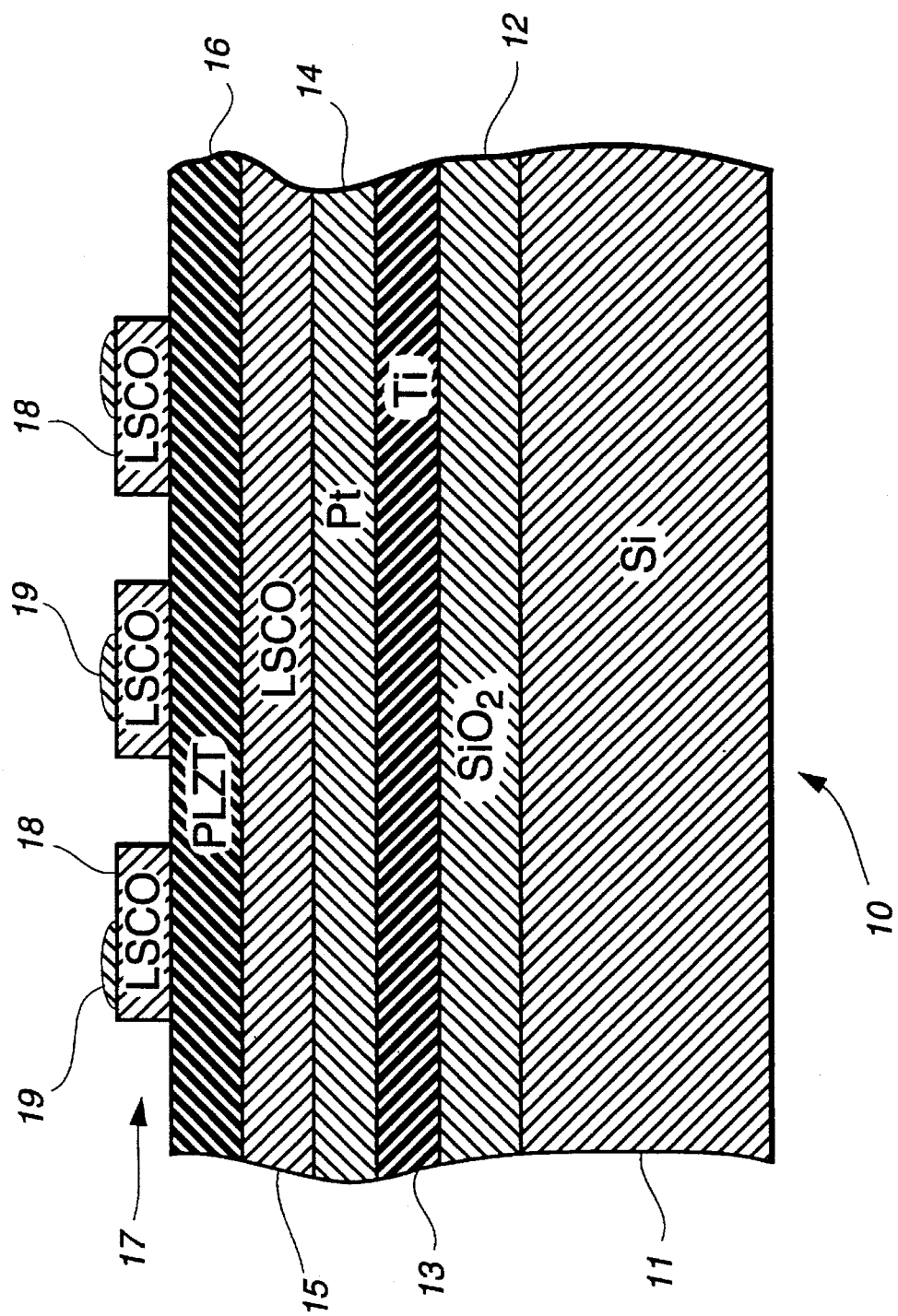
FIG. 1 is a representative elevational section of a ferroelectric heterostructure of the present invention.

A typical ferroelectric heterostructure memory element 10 prepared according to the present invention is shown in FIG. 1 comprising as a substrate a single crystal oriented [001] silicon wafer 11 the surface of which has been thermally wet-oxidized to form an electronic grade amorphous $SiO_2$ layer 12 of about 100 nm thickness. Another silicon-coating layer material particularly useful in piezoelectric devices is silicon nitride, $Si_3N_4$. Upon the $SiO_2$ layer surface at a temperature of about 600°–680° C. was grown a priming layer 13 of about 50 nm of titanium using pulsed laser deposition (PLD) with an excimer laser (248 nm) at an energy density in the range of about 2–2.5 J/cm². A 50–150 nm layer of platinum metal was then likewise grown on Ti layer 13. Other common growth techniques, such as sputtering, chemical vapor deposition (CVD), and electron-beam deposition, could similarly be employed.

With targets of the appropriate composition, the PLD apparatus was used to sequentially deposit the electrode and ferroelectric layers. At the usual temperature range of about 550° to 700° C. and in an atmosphere of about 13.3 Pa oxygen partial pressure, a first electrode layer 15 of LSCO, typically a composition of $L_{1-x}Sr_xCoO_3$ where x is about 0.15 to 0.85, preferably about 0.5, was grown on the Pt layer 14 to a thickness of about 50–150 nm, preferably about 100 nm. Other known metal oxide electrode materials, such as $RuO_x$, $SrRuO_3$, and $LaSrCrO_3$, would be equally viable.

A ferroelectric layer 16 of PLZT followed at about 100–500 nm, typically 300 nm. The composition of the PLZT material was $Pb_{0.9}La_{0.1}Zr_{0.2}Ti_{0.8}O_3$ in this example, but could be varied over a wide range depending on the intended application. Also, 1% to 10% lanthanum or niobium doping, preferably about 4% to 6%, is useful in optimizing the ferroelectric properties. Other ferroelectric, or paraelectric, materials, such as barium titanate, barium strontium titanate, lead titanate, bismuth titanate, bismuth strontium tantalate, bismuth strontium niobate, and potassium tantalate niobate, could similarly be employed for layer 16 in high dielectric constant capacitor applications and in pyroelectric and piezoelectric devices. A top electrode layer 17 of about 100 nm LSCO was then grown and the completed heterostructure was cooled to ambient temperature at an optimum rate of about 5°–20° C./min in an atmosphere having an oxygen partial pressure ranging from about $1 \times 10^2$ to about $1 \times 10^5$ Pa. X-ray diffraction examination of the completed polycrystalline heterostructure confirmed that the ferroelectric stack was fully in the perovskite phase.

Using a common photolithographic process, 50 μm diameter test capacitor electrodes 18 were fashioned of the upper LSCO layer 17 upon which Pt/Au electrical contacts 19 were deposited. Complementary contact with bottom electrode layer 15 was established by capacitive coupling through a large conductive pad, not shown, elsewhere on the surface of the structure. Typical ferroelectric testing of the capacitor heterostructure showed very desirable fatigue, aging, and retention properties which were eminently suitable for long term, non-volatile memory application. Remnant polarization values of about 15–20 μC/cm$^2$ at 5 V exhibited by the device are quite sufficient for this purpose. Additional testing at more extreme conditions of elevated temperature and the presence of dc bias showed equally satisfactory results. At about 100° C., for example, the device showed good read-write endurance over at least $10^{11}$ cycles.

Figure 2:
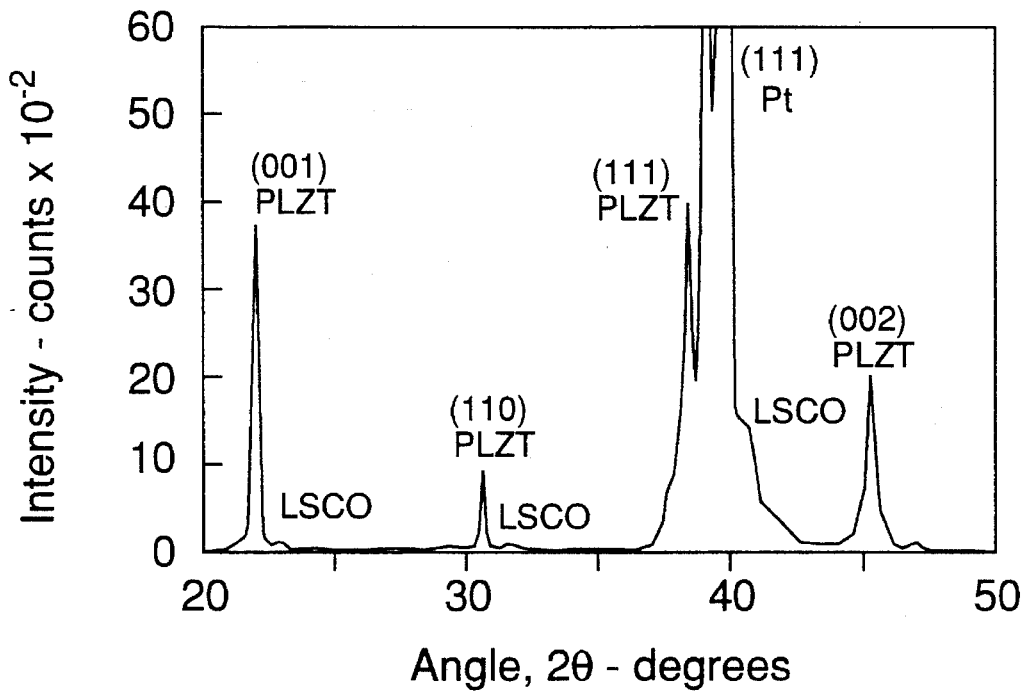
FIG. 2 is a representative x-ray diffraction pattern of a highly ferroelectric heterostructure obtained from growth upon a substrate of $Si/SiO_2$ according to the present invention.
Figure 3:
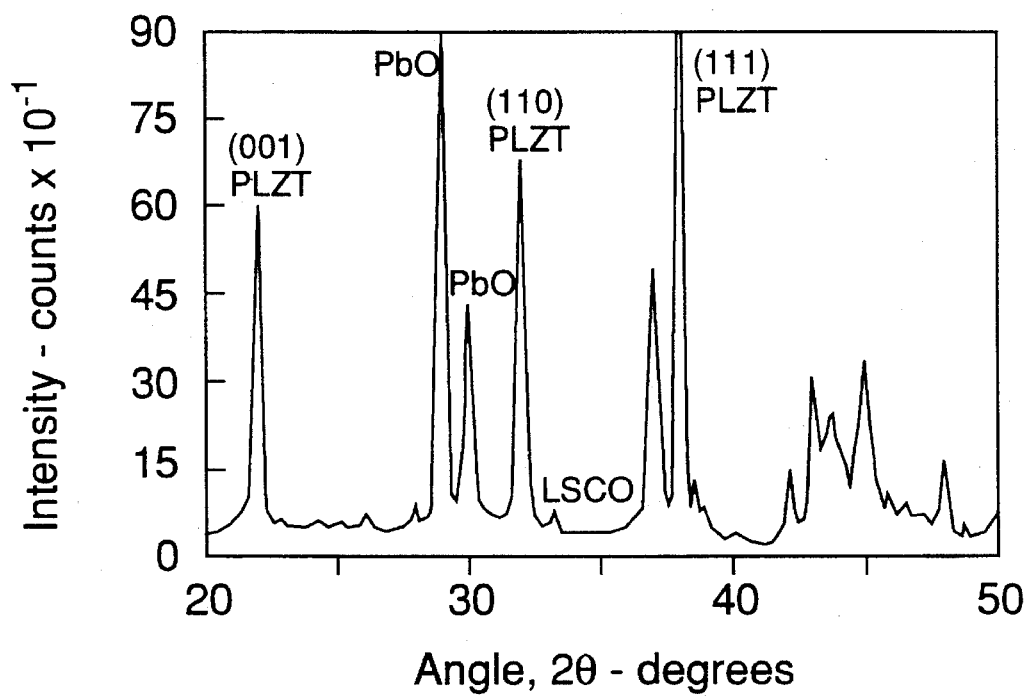
FIG. 3 is a representative x-ray diffraction pattern of a weakly ferroelectric heterostructure resulting from growth upon a substrate lacking a $SiO_2$ layer.

Additional heterostructures were grown to provide samples for testing the efficacy of the processing of the present invention. In one set of such samples, a first heterostructure was prepared as described above to include SiO$_2$ layer 12 while in a second sample the SiO$_2$ layer was omitted. Respective x-ray diffraction patterns of the samples depicted in FIGS. 2 and 3 show the preferential ferroelectric orientation of the PLZT layers (FIG. 2) grown with SiO$_2$ interlayer 12 and the weak orientation and diffraction peaks of impurity phases (FIG. 3) resulting from lack of the SiO$_2$ layer. The respective intensities of the patterns are particularly remarkable.

Figure 4:
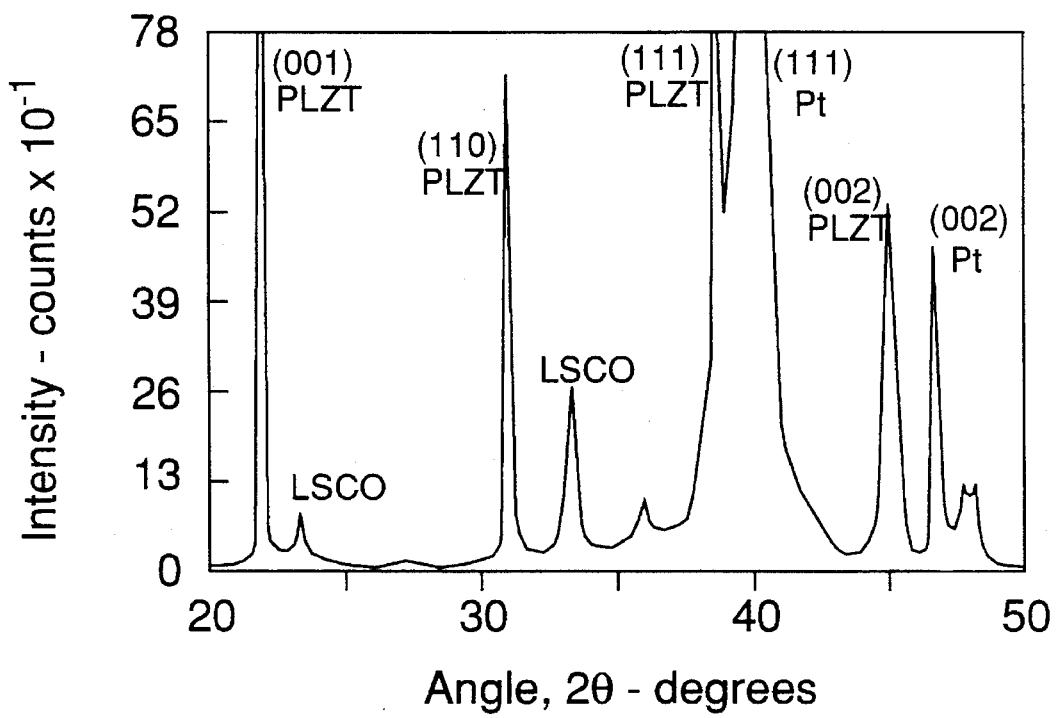
FIG. 4 is a representative x-ray diffraction pattern of a highly ferroelectric heterostructure obtained from growth upon a LSCO electrode underlayer.
Figure 5:
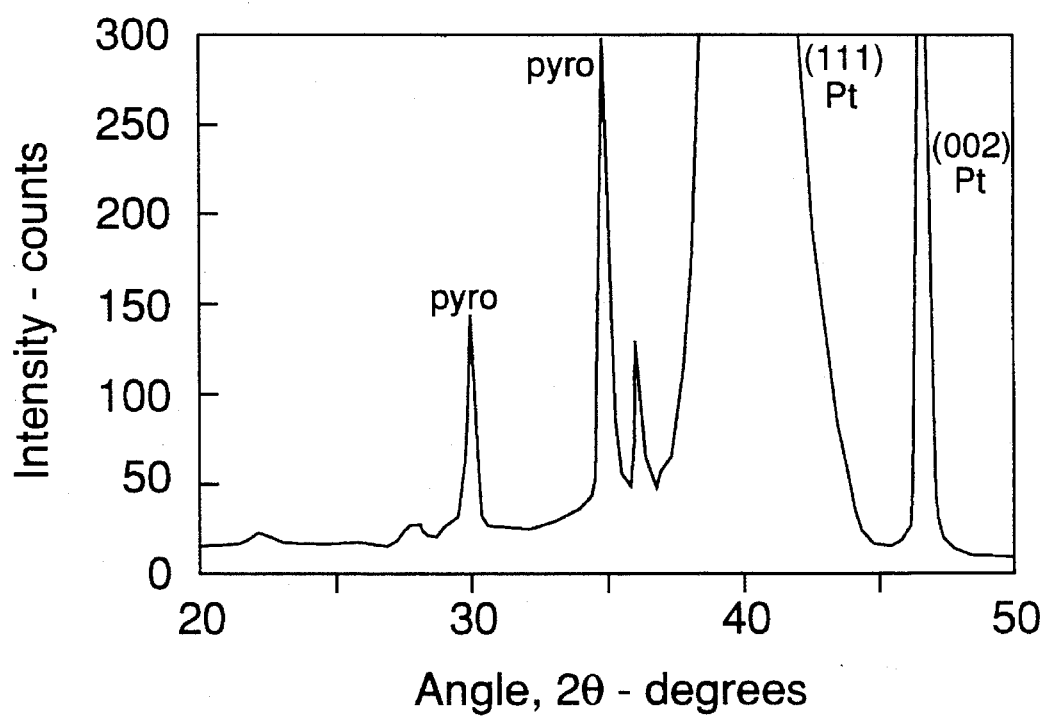
FIG. 5 is a representative x-ray diffraction pattern of a weakly ferroelectric heterostructure obtained from growth without a LSCO electrode underlayer.

Comparative x-ray diffraction patterns of FIGS. 4 and 5 were obtained from a second set of samples which differed, respectively, in the inclusion and omission of LSCO layer 15 needed to form the hybrid metal/metal oxide electrode with Pt layer 14 beneath PLZT ferroelectric layer 16 of the heterostructure stack (FIG. 1). The effect of the LSCO electrode layer 15 can be seen most dramatically in the x-ray diffraction peaks of the PLZT ferroelectric perovskite phase (FIG. 4), as well as in the intensity of the diffractions. Without the LSCO electrode layer, only the non-ferroelectric pyrochlore phase (pyro) of the PLZT was formed (FIG. 5).

Figure 6:
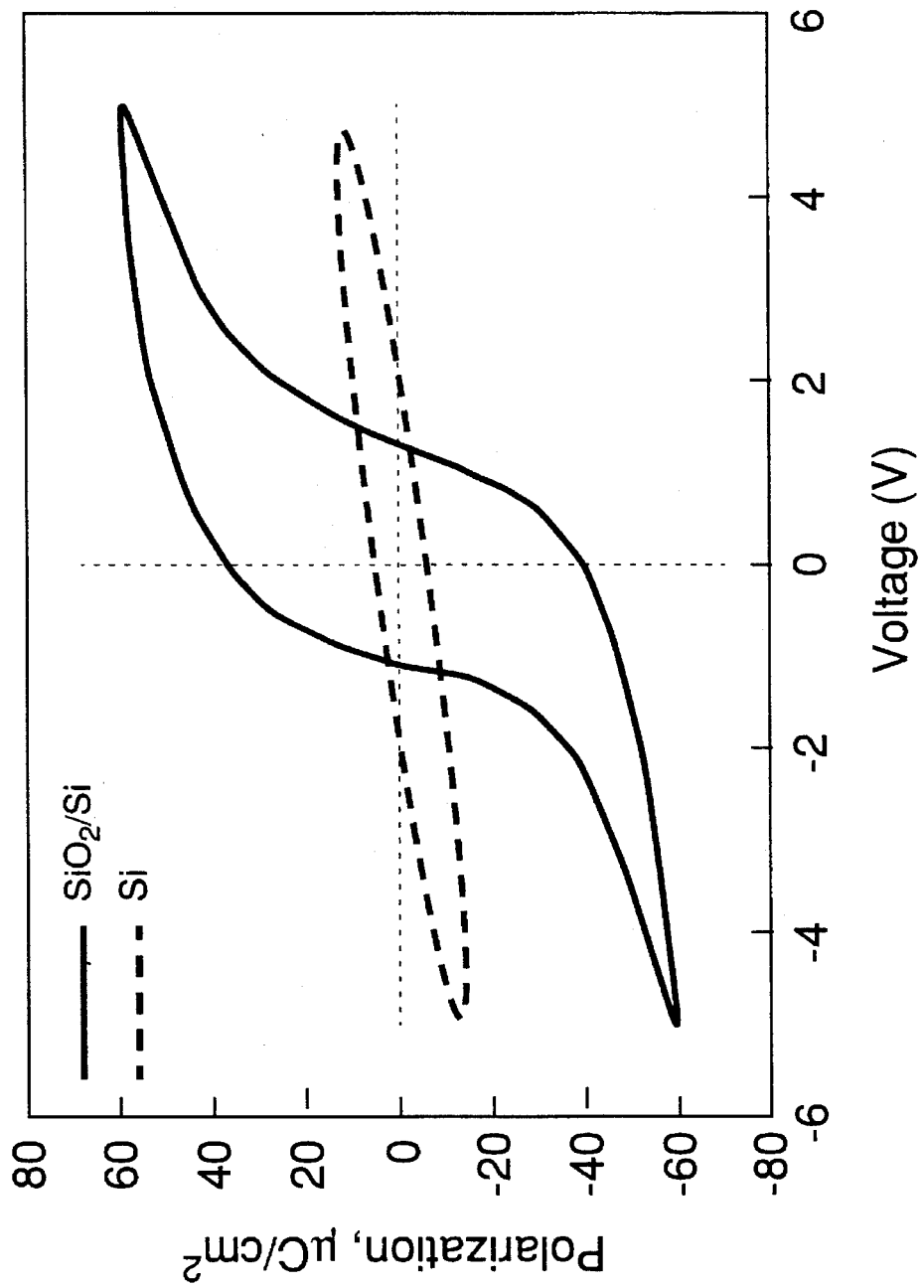
FIG. 6 is a graph of comparative hysteresis loops obtained from testing heterostructures characterized in FIGS. 2 and 3.
Figure 7:
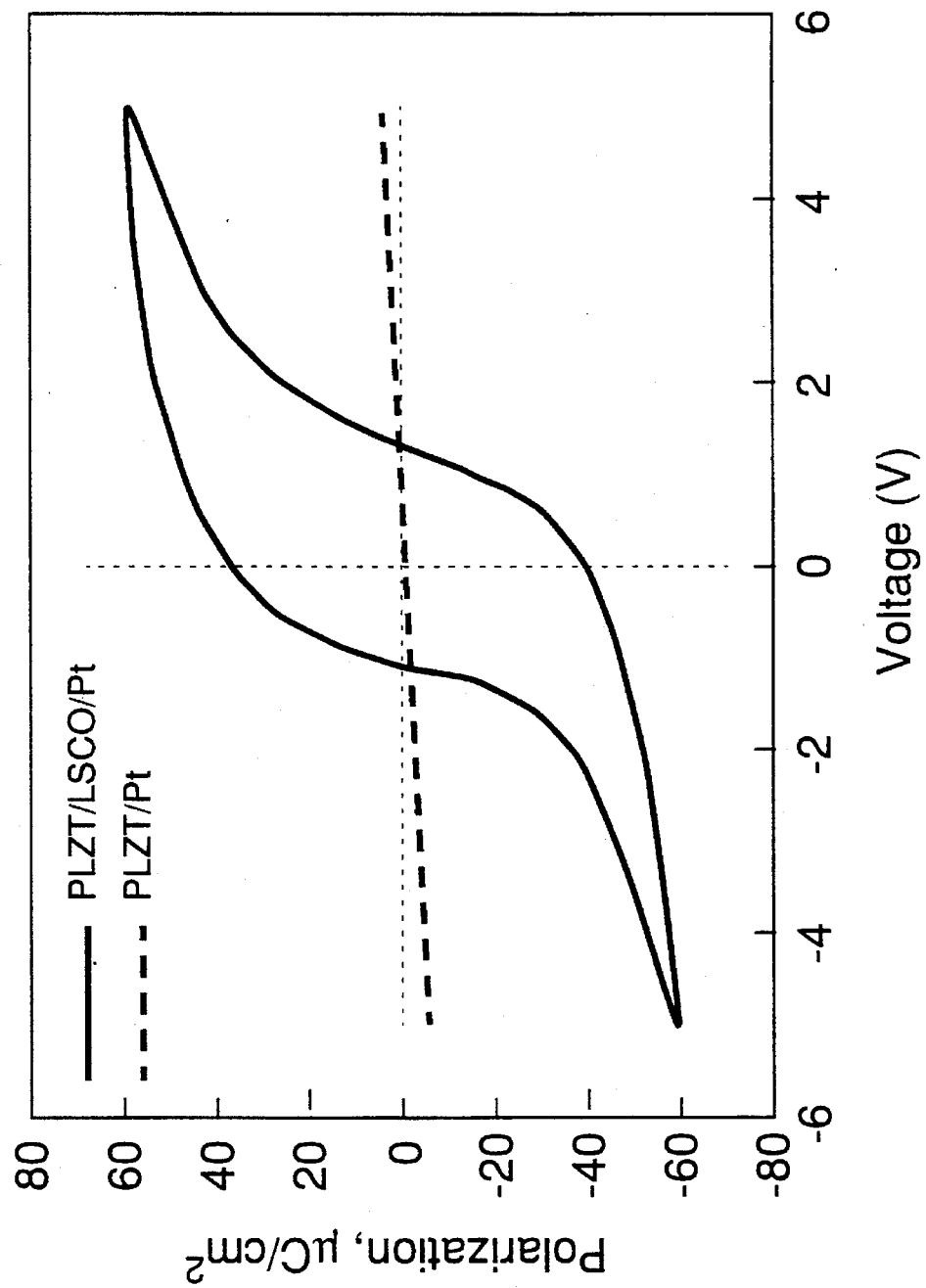
FIG. 7 is a graph of comparative hysteresis loops obtained from testing heterostructures characterized in FIGS. 4 and 5.

Subsequent ferroelectric properties measurements highlighted the significant contribution of the SiO$_2$ layer residing upon the Si wafer substrate, as may be observed in the comparative hysteresis loops of those samples (FIG. 6). Such measurements also confirmed the distinct advantage that the LSCO electrode layer provides for both surface characteristics enabling preferential nucleation of the ferroelectric perovskite phase and superior ferroelectric reliability characteristics. The comparative hysteresis loops (FIG. 7) of heterostructures fabricated with and without the LSCO electrode layer illustrate the substantial absence of ferroelectric properties in the latter sample.

The processes and ferroelectric heterostructure capacitor materials of the present invention have application for a wide range of devices, such as dielectrics for DRAM capacitors, ferroelectric FET elements for non-destructive readout memories, and electro-optic perovskites grown on SiO$_2$/Si substrates for integrated optics, pyroelectric detectors, and the like. In another important aspect of these ferroelectric thin films using hybrid metal/metal oxide electrodes is their application in nonvolatile memory storage media, such as FRAMs.

Additional devices in the form of magnetoresistive random access memories (MRAM) and magnetic recording anti sensing elements may be realized through the integration of ferromagnetic elements and transistor circuitry enabled by the present invention. Such structures are also of particular value for use in integrated microelectromechanical systems in which piezoelectric properties of the ferroelectric materials are utilized. These and other applications will become apparent to the skilled artisan in the light of the foregoing description and are to be considered within the scope of the invention as defined in the appended claims.

What is claimed is:

1. A ferroelectric capacitor heterostructure comprising a silicon substrate having a primed silicon compound surface and at least one crystalline ferroelectric material layer grown above said surface characterized in that a layer of metal grown on said surface provides electrical conductivity for said heterostructure and with a metallic oxide layer grown thereon forms a hybrid capacitor electrode substrate for said ferroelectric layer.

2. A structure according to claim 1 characterized in that said silicon compound is selected from the group consisting of silicon dioxide and silicon nitride and is primed with a compound selected from the group consisting of titanium, tantalum, and titanium dioxide.

3. A structure according to claim 1 characterized in that said layer of metal consists essentially of platinum.

4. A structure according to claim 1 characterized in that said metallic oxide layer comprises a polycrystalline growth of a material selected from the group consisting of lanthanum strontium cobalt oxide, lanthanum strontium chromium oxide, ruthenium oxide, and strontium ruthenium oxide.

5. A structure according to claim 1 characterized in that said ferroelectric layer comprises a polycrystalline growth of a material selected from the group consisting of lead lanthanum zirconium titanate, barium titanate, barium strontium titanate, lead titanate, bismuth titanate, bismuth strontium tantalate, bismuth strontium niobate, and potassium tantalate niobate.

6. A structure according to claim 4 characterized in that said ferroelectric layer material comprises 1% to 10% of a doping material selected from the group consisting of lanthanum and niobium.

7. A method of preparing a ferroelectric capacitor heterostructure which comprises growing at least one crystalline ferroelectric material layer above a silicon substrate having a primed silicon compound surface layer characterized in that a layer of metal is grown on said surface layer to provide electrical conductivity for said heterostructure and a metallic oxide layer is grown on said metal to form therewith a hybrid capacitor electrode substrate for said ferroelectric layer.

8. A method according to claim 7 characterized in that said silicon compound is primed with a compound selected from the group consisting of titanium, tantalum, and titanium dioxide and said layer of metal consists essentially of platinum.

9. A method according to claim 7 characterized in that said metallic oxide layer is formed by polycrystalline growth of a material selected from the group consisting of lanthanum strontium cobalt oxide, lanthanum strontium chromium oxide, ruthenium oxide, and strontium ruthenium oxide.

10. A method according to claim 7 characterized in that said ferroelectric layer is formed by polycrystalline growth on said metallic oxide layer.

11. A method according to claim 10 characterized in that the material of said ferroelectric layer is selected from the group consisting of lead lanthanum zirconium titanate, barium titanate, barium strontium titanate, lead titanate, bismuth titanate, bismuth strontium tantalate, bismuth strontium niobate, and potassium tantalate niobate.

12. A method according to claim 10 characterized in that an electrode layer of said metallic oxide is grown on said ferroelectric layer.

13. A method according to claim 1 characterized in that said ferroelectric layer is grown on said hybrid capacitor electrode substrate at a temperature in the range of about 550° to 700° C. and is cooled at a rate of about 5° to 25° C./min from said growth temperature to an operating ambient in an atmosphere comprising a partial pressure of oxygen ranging from about $1 \times 10^2$ to $1 \times 10^5$ Pa.

* * * * *